United States Patent
Maszara et al.

(10) Patent No.: US 8,334,177 B2
(45) Date of Patent: Dec. 18, 2012

(54) METHODS FOR FORMING ISOLATED FIN STRUCTURES ON BULK SEMICONDUCTOR MATERIAL

(75) Inventors: Witold Maszara, Morgan Hill, CA (US); Hemant Adhikari, Albany, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/278,010

(22) Filed: Oct. 20, 2011

(65) Prior Publication Data
US 2012/0040517 A1 Feb. 16, 2012

Related U.S. Application Data

(62) Division of application No. 12/575,344, filed on Oct. 7, 2009, now Pat. No. 8,101,486.

(51) Int. Cl.
*H01L 21/84* (2006.01)
*H01L 21/8238* (2006.01)
*H01L 21/336* (2006.01)

(52) U.S. Cl. ........ 438/151; 438/156; 438/164; 438/229; 438/268; 438/294; 257/E21.159; 257/E21.41; 257/E21.54; 257/E21.639

(58) Field of Classification Search ........... 257/E21.159, 257/E21.41, E21.54, E21.639
See application file for complete search history.

(56) References Cited

U.S. PATENT DOCUMENTS

| | | | |
|---|---|---|---|
| 6,642,090 B1 | 11/2003 | Fried et al. | |
| 6,872,647 B1 | 3/2005 | Yu et al. | |
| 6,921,963 B2 | 7/2005 | Krivokapic et al. | |
| 7,419,857 B2 * | 9/2008 | Choi et al. | 438/157 |
| 7,425,740 B2 * | 9/2008 | Liu et al. | 257/306 |
| 7,495,285 B2 | 2/2009 | Lee | |
| 7,517,764 B2 | 4/2009 | Booth, Jr. et al. | |
| 7,611,938 B2 | 11/2009 | Cheng et al. | |
| 7,615,449 B2 | 11/2009 | Chung et al. | |
| 2004/0150029 A1 | 8/2004 | Lee | |
| 2004/0266077 A1 | 12/2004 | Yeo et al. | |
| 2005/0272192 A1 | 12/2005 | Oh et al. | |
| 2006/0091428 A1 | 5/2006 | Yeo et al. | |
| 2006/0113522 A1 | 6/2006 | Lee et al. | |
| 2007/0075351 A1 | 4/2007 | Schulz et al. | |
| 2008/0050902 A1 | 2/2008 | John et al. | |
| 2008/0064149 A1 | 3/2008 | Cohen | |
| 2008/0265308 A1 | 10/2008 | Lee | |
| 2008/0296702 A1 | 12/2008 | Lee et al. | |

(Continued)

OTHER PUBLICATIONS

Arney, S.C., et al. "Formation of submicron silicon-on-insulator structures by lateral oxidation of substrate-silicon islands," J.Vac.Sci.Technol. vol. B6, No. 1. Jan./Feb. 1988: pp. 341-345.

(Continued)

*Primary Examiner* — Mohsen Ahmadi
(74) *Attorney, Agent, or Firm* — Ingrassia Fisher & Lorenz, P.C.

(57) ABSTRACT

Methods are provided for fabricating a semiconductor device. A method comprises forming a layer of a first semiconductor material overlying the bulk substrate and forming a layer of a second semiconductor material overlying the layer of the first semiconductor material. The method further comprises creating a fin pattern mask on the layer of the second semiconductor material and anisotropically etching the layer of the second semiconductor material and the layer of the first semiconductor material using the fin pattern mask as an etch mask. The anisotropic etching results in a fin formed from the second semiconductor material and an exposed region of first semiconductor material underlying the fin. The method further comprises forming an isolation layer in the exposed region of first semiconductor material underlying the fin.

15 Claims, 4 Drawing Sheets

U.S. PATENT DOCUMENTS

| | | |
|---|---|---|
| 2009/0121288 A1 | 5/2009 | Patruno |
| 2009/0127592 A1 | 5/2009 | El-Kareh et al. |
| 2009/0251946 A1* | 10/2009 | Juengling .................... 365/149 |
| 2009/0253238 A1 | 10/2009 | Shi et al. |
| 2009/0278196 A1 | 11/2009 | Chang et al. |
| 2010/0015768 A1 | 1/2010 | Jang et al. |
| 2010/0015778 A1 | 1/2010 | Lin et al. |
| 2010/0015802 A1 | 1/2010 | Snyder et al. |
| 2010/0075473 A1 | 3/2010 | Gibbons |
| 2010/0127327 A1 | 5/2010 | Chidambarrao |
| 2010/0144121 A1 | 6/2010 | Chang et al. |
| 2010/0163971 A1 | 7/2010 | Hung et al. |
| 2010/0248454 A1 | 9/2010 | Maszara et al. |

OTHER PUBLICATIONS

Hisamoto, D., et al. "A Fully Depleted Lean-channel Transistor (DELTA)—A novel vertical ultra thing SOI MOSFET—". IEEE, 1989. pp. 833-836.

U.S. Notice of Allowance for U.S. Appl. No. 12/413,174 mailed Oct. 4, 2010.

* cited by examiner

METHODS FOR FORMING ISOLATED FIN STRUCTURES ON BULK SEMICONDUCTOR MATERIAL

CROSS-REFERENCE TO RELATED APPLICATIONS

This is a division of U.S. application Ser. No. 12/575,344, filed Oct. 7, 2009, and issued on Jan. 24, 2012 as U.S. Pat. No. 8,101,486.

TECHNICAL FIELD

Embodiments of the subject matter generally relate to semiconductor device structures and related fabrication methods, and more particularly, embodiments of the subject matter relate to methods for forming semiconductor device structures having conductive fins which are electrically isolated from a bulk semiconductor substrate.

BACKGROUND

Transistors, such as metal oxide semiconductor field-effect transistors (MOSFETs), are the core building block of the vast majority of semiconductor devices. Some semiconductor devices, such as high performance processor devices, can include millions of transistors. For such devices, decreasing transistors size, and thus increasing transistor density, has traditionally been a high priority in the semiconductor manufacturing industry.

A FinFET is a type of transistor that can be fabricated using very small scale processes. FIG. 1 is a simplified perspective view of a FinFET 100, which is formed on a semiconductor wafer substrate 102. A FinFET is named for its use of one or more conductive fins 104. As shown in FIG. 1, each fin 104 extends between a source region 106 and a drain region 108 of FinFET 100. FinFET 100 includes a gate structure 110 that is formed across fins 104. The surface area of the fins 104 in contact with gate structure 110 determines the effective channel of FinFET 100.

FinFET devices have historically been formed using silicon-on-insulator (SOI) substrates. Using an SOI substrate, the conductive fins are formed from the silicon material, while the insulator layer provides isolation between adjacent FinFET devices. Bulk silicon substrates are less expensive than SOI substrates, and FinFET devices can also be fabricated using bulk silicon if appropriate isolation methodologies are utilized.

BRIEF SUMMARY

A method is provided for fabricating a semiconductor device on a bulk substrate. The method comprises forming a layer of a first semiconductor material overlying the bulk substrate and forming a layer of a second semiconductor material overlying the layer of the first semiconductor material. The method further comprises creating a fin pattern mask on the layer of the second semiconductor material and anisotropically etching the layer of the second semiconductor material and the layer of the first semiconductor material using the fin pattern mask as an etch mask. The anisotropic etching results in a fin formed from the second semiconductor material and an exposed region of first semiconductor material underlying the fin. The method further comprises forming an isolation layer in the exposed region of first semiconductor material underlying the fin.

Another method is provided for manufacturing a finned semiconductor device structure. The method comprises providing a substrate comprising bulk semiconductor material, a layer of a first semiconductor material on the bulk semiconductor material, and a layer of a second semiconductor material on the layer of the first semiconductor material. The method further comprises selectively removing portions of the layer of second semiconductor material and the layer of first semiconductor material, which results in a fin formed from the second semiconductor material overlying an exposed region of first semiconductor material. The method further comprises forming an isolation layer in the exposed region of first semiconductor material.

In another embodiment, a method for fabricating a semiconductor device is provided. The method comprises providing a bulk substrate formed from a bulk semiconductor material, forming a layer of a first semiconductor material overlying the bulk semiconductor material, and forming a layer of a second semiconductor material overlying the layer of the first semiconductor material. The second semiconductor material has an oxidation rate that is less than the oxidation rate of the first semiconductor material. The method further comprises creating a fin pattern mask on the layer of the second semiconductor material and anisotropically etching the layer of the second semiconductor material using the fin pattern mask as an etch mask, which results in a fin formed from the second semiconductor material. Anisotropically etching the layer of the second semiconductor material also removes portions of the first semiconductor material, resulting in an exposed region of first semiconductor material underlying the fin. The method further comprises oxidizing the exposed region of first semiconductor material underlying the fin, such that the fin is electrically isolated from the bulk semiconductor material.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Techniques and technologies described herein may be utilized to fabricate MOS transistor devices, including NMOS transistor devices, PMOS transistor devices, and CMOS transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. Various steps in the fabrication of semiconductor devices are well known and so, in the interest of brevity, many conventional steps will only be mentioned briefly herein or will be omitted entirely without providing the well known process details.

A variety of FinFET devices and related fabrication processes are known. In accordance with the traditional manufacturing techniques, conductive fins in a FinFET device are formed using photolithography, etching, and other conventional process steps. FinFET performance is dependent on the height, thickness, and pitch of fins, and these dimensions should be uniform and closely controlled during manufacturing. In this regard, fabricating FinFETs using modern semiconductor manufacturing processes (e.g., 22 nm and smaller technologies) can be challenging due to the importance of controlling the dimensions of the fins. The fabrication techniques described herein can be utilized to precisely control the fin dimensions—in particular, the fin height—of fin structures formed from a bulk semiconductor substrate.

The techniques and technologies described herein can be utilized to form fin structures for finned semiconductor devices, using a bulk semiconductor substrate rather than an SOI substrate. In this regard, FIGS. 2-6 are cross sectional views that illustrate an embodiment of a finned semiconductor device structure and a related fabrication method. This fabrication process represents one implementation of a method that is suitable for use with finned semiconductor devices, such as FinFETs or other multi-gate transistor devices. In practice, however, the fabrication process could be used to form semiconductor fins that are ultimately used for other semiconductor devices.

Figure 2:
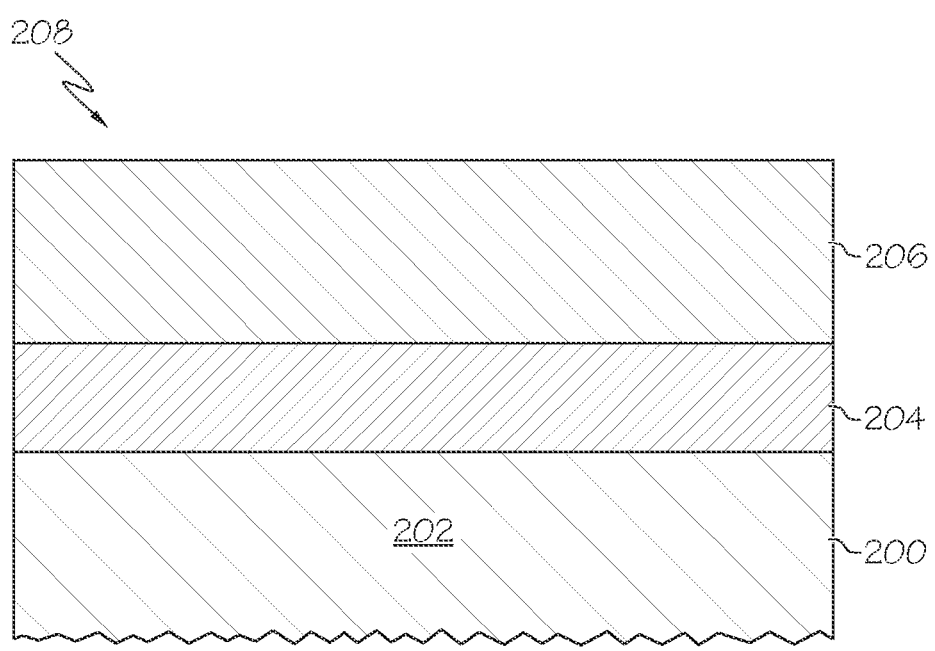
FIGS. 2-8 illustrate, in cross section, a semiconductor device structure and exemplary methods for fabricating the semiconductor device structure in exemplary embodiments.

Referring now to FIG. 2, in an exemplary embodiment, the fabrication process begins by providing an appropriate bulk substrate 200, forming a first layer of semiconductor material 204 overlying the bulk substrate 200, and forming an upper layer of semiconductor material 206 overlying the intermediate layer of the semiconductor material 204. In this regard, the first layer of semiconductor material 204 is alternatively referred to herein as the intermediate layer or the intermediate semiconductor material, and the second layer of semiconductor material 206 is alternatively referred to herein as the upper layer of upper semiconductor material. FIG. 2 depicts the semiconductor device structure 208 after forming the layers of semiconductor material 204, 206 overlying the bulk substrate 200. It should be appreciated that the fabrication of a finned semiconductor device need not always begin with a bulk substrate, but rather, an embodiment of the fabrication process may instead begin with the semiconductor device structure 208 depicted in FIG. 2. Thus, a suitably pre-fabricated wafer could be obtained from a vendor, where the pre-fabricated wafer would have bulk semiconductor material having an intermediate layer of semiconductor material formed on the bulk semiconductor material, and an upper layer of semiconductor material formed on the intermediate layer of semiconductor material. Accordingly, fabrication of the fin structures described herein may begin by providing such a pre-fabricated wafer or substrate.

As described in greater detail below, in an exemplary embodiment, the oxidation rate of the intermediate semiconductor material 204 is greater than the oxidation rate of the upper semiconductor material 206, such that an exposed region of the intermediate semiconductor material 204 underlying the upper semiconductor material 206 may be fully consumed during subsequent oxidation while leaving the upper semiconductor material 206 substantially intact, thereby isolating the upper semiconductor material 206 from the bulk semiconductor material 202. In this regard, the oxidation rate of the intermediate semiconductor material 204 is preferably at least three times greater than the oxidation rate of the second semiconductor material 206.

In an exemplary embodiment, the bulk substrate 200 is formed from or otherwise comprises a semiconductor material 202 (alternatively referred to herein as the bulk semiconductor material). The bulk semiconductor material 202 is preferably a silicon material as typically used in the semiconductor industry, e.g., relatively pure silicon as well as silicon admixed with other elements such as germanium, carbon, and the like. Alternatively, bulk semiconductor material 202 can be germanium, gallium arsenide, or the like. The bulk semiconductor material 202 need not be doped, although it may be very lightly doped as either N-type or P-type, without impacting the manufacturing process described here. For example, bulk silicon substrates are often provided as lightly doped P-type substrates, and a lightly doped P-type semiconductor material 202 could be used for the embodiment described here. Of course, the bulk semiconductor material 202 can be subsequently doped in an appropriate manner to form active regions in a manner that is well understood by those familiar with semiconductor manufacturing techniques.

In accordance with one or more embodiments, the intermediate layer of semiconductor material 204 is formed by epitaxially growing a layer of a different type of semiconductor material on the bulk semiconductor material 202. In an exemplary embodiment, the bulk semiconductor material 202 comprises silicon, wherein the intermediate layer of semiconductor material 204 is formed by epitaxially growing a silicon material on the bulk semiconductor material 202. Preferably, the intermediate semiconductor material 204 is realized as silicon germanium which is grown on an exposed surface of the bulk semiconductor material 202 in accordance with known process techniques. It should be noted that other materials having the same general properties and characteristics could be used in lieu of silicon germanium. That said, silicon germanium is commonly used for other purposes in semiconductor manufacturing processes, is accepted for use in the industry, and is well documented. Accordingly, preferred embodiments employ silicon germanium for the intermediate semiconductor material 204.

As described in greater detail below, in an exemplary embodiment, as the ratio of the oxidation rate of the intermediate semiconductor material 204 to the oxidation rate of the upper semiconductor material 206 increases, the thickness of the intermediate semiconductor material 204 decreases. For example, when realized as silicon germanium, depending on the embodiment, the thickness of the semiconductor material 204 may range from about 10 nanometers (nm) to about 100 nm. The oxidation rate of the silicon germanium layer 204 is directly related to its germanium concentration, as will be appreciated in the art. Preferably, the intermediate semiconductor material 204 has a germanium concentration of greater than about ten percent germanium. Accordingly, when the intermediate semiconductor material 204 is realized as silicon germanium having a germanium concentration of about ten percent germanium, the thickness of the intermediate semiconductor material 204 may be greater than the thickness of the intermediate semiconductor material 204 when the intermediate semiconductor material 204 is realized with greater germanium concentration. In an exemplary embodiment, the intermediate semiconductor material 204 comprises silicon germanium having a germanium concentration of about thirty percent germanium and a thickness of about 30 nm.

In accordance with one or more embodiments, the upper layer of semiconductor material 206 is formed by epitaxially growing it on the exposed surface of the intermediate layer of semiconductor material 204. In an exemplary embodiment, the bulk semiconductor material 202 comprises silicon and the intermediate semiconductor material 204 comprises silicon germanium, wherein the upper layer of semiconductor material 206 is formed by epitaxially growing silicon on the silicon germanium that forms the intermediate layer of semiconductor material 204. In this regard, the upper semiconductor material 206 and the bulk semiconductor material 202 comprise the same material, e.g., silicon, however, the use of the same semiconductor material is not always required, and alternate embodiments could utilize different materials for bulk semiconductor material 202 and the upper semiconductor material 206. Epitaxial silicon can be grown on silicon germanium in accordance with known process techniques, as described briefly above. In practice, second semiconductor material 206 has a thickness in the range of about 20 to 50 nm, although thicknesses outside of this typical range could be utilized. Notably, semiconductor material 206 will ultimately be used to form conductive fin structures. Therefore, semiconductor material 206 preferably comprises device quality silicon that can be epitaxially grown with little or no defects or contamination. It should be noted that other materials having these properties and characteristics could be used for the upper semiconductor material 206 (in lieu of silicon). That said, preferred embodiments will utilize silicon for the upper semiconductor material 206.

In an exemplary embodiment, the fabrication process continues by forming two layers of insulating material 214, 216 overlying the upper layer of semiconductor material 206 and removing portions of the layers of insulating material 214, 216 to create and define a fin pattern mask 210. In certain embodiments, first layer of insulating material 214 is formed from an oxide material. This oxide material may be a thermally grown silicon dioxide formed by heating semiconductor device structure 212 in an oxidizing ambient, or it may be a deposited material such as silicon oxide. Alternatively, first layer of insulating material 214 could be silicon nitride, a high-k dielectric material such as hafnium compound (e.g., hafnium silicate, hafnium oxide or hafnium silicon oxynitride), or the like. The insulating material 214 can be deposited by chemical vapor deposition (CVD), low pressure chemical vapor deposition (LPCVD), or plasma enhanced chemical vapor deposition (PECVD). In practice, first layer of insulating material 214 is typically about 5 nm to 30 nm in thickness. In preferred embodiments, second layer of insulating material 216 is formed by depositing silicon nitride on first layer of insulating material 214, to a thickness within the range of about 5 nm to 30 nm. In practice, silicon nitride can be deposited onto first layer of insulating material 214 using, e.g., LPCVD. The nitride material is preferable because it accommodates the selective etching of underlying semiconductor material 204, 206 when subsequently used as an etch mask, and because it is a good oxygen barrier. Alternatively, silicon oxynitride or amorphous or polycrystalline silicon could be used for second layer of insulating material 216. Although the illustrated embodiment includes a lower oxide layer and an upper nitride layer for creating the fin pattern mask 210, an alternate embodiment of the fin pattern mask 210 could have a lower nitride layer and an upper oxide layer. Furthermore, more than two layers of insulating material could be employed. Moreover, in alternate embodiments (not shown), the fin pattern mask 210 includes only an overlying layer of nitride material without an underlying layer of oxide material.

Figure 3:
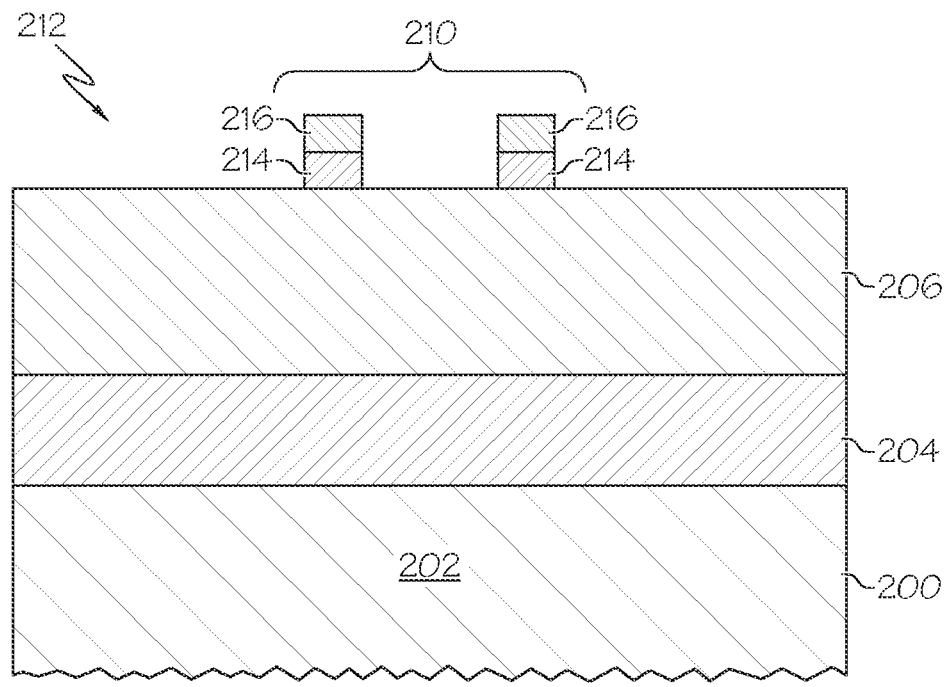

Still referring to FIG. 3, the fin pattern mask 210 can be formed using process steps such as, without limitation: material deposition or formation; photolithography; spacer imaging; etching; and cleaning. For instance, a soft mask (formed from photoresist material) or a hard mask (formed using spacers) can be formed overlying semiconductor device structure to serve as an etch mask. Thereafter, the unprotected portions of first layer of insulating material 214 and second layer of insulating material 216 can be anisotropically etched using an appropriate etchant chemistry, resulting in semiconductor device structure 212 shown in FIG. 3. Thus, the fin pattern mask 210 is created from the insulating materials 214, 216 overlying the upper layer of semiconductor material 206 and represents a hard mask that includes masking features defined by the remaining portions of the insulating materials 214, 216. Notably, fin pattern mask 210 depicted in FIG. 3 includes two features corresponding to two respective fins that are subsequently formed from the upper semiconductor material 206.

Figure 4:
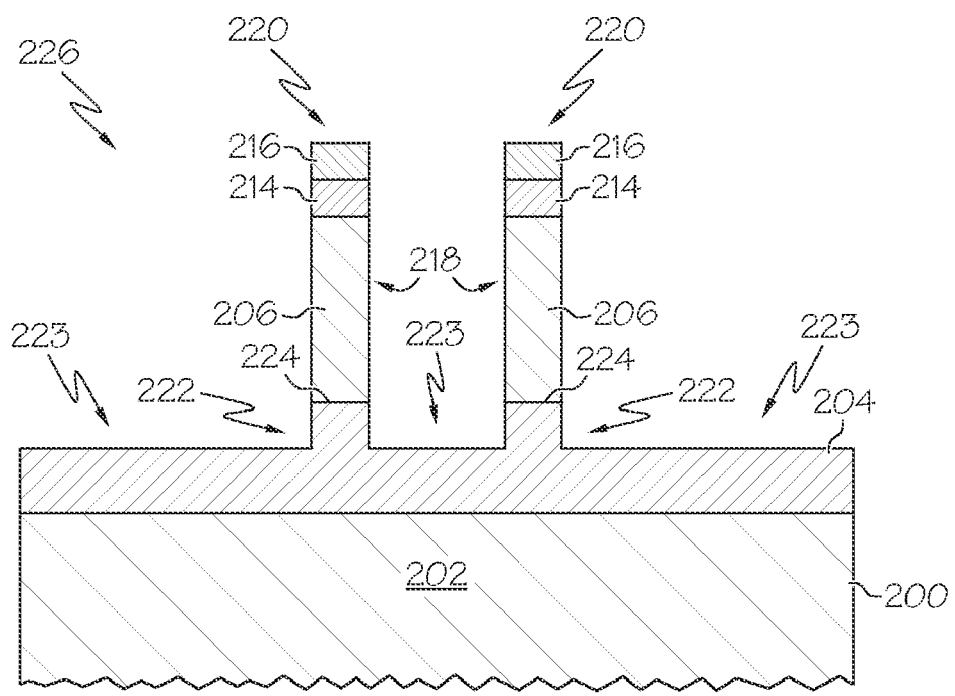

Referring now to FIG. 4, in an exemplary embodiment, the fabrication process continues by selectively removing portions of the upper semiconductor material 206 and the intermediate semiconductor material 204, resulting in a semiconductor device structure 226 having one or more fins 218 formed from the upper semiconductor material 206, with each fin 218 overlying an exposed region 222 (or neck region) of the intermediate semiconductor material 204. In an exemplary embodiment, the fabrication process selectively removes portions of the upper layer of semiconductor material 206 by anisotropically etching exposed portions of the upper semiconductor material 206 using the fin pattern mask 210 as an etch mask, which protects portions of the upper semiconductor material 206 underlying the fin pattern mask 210. In an exemplary embodiment, the fabrication process employs an anisotropic etchant that also removes portions of the intermediate semiconductor material 204 while using the fin pattern mask 210 as an etch mask, thereby exposing regions 223 of the intermediate semiconductor material 204 surrounding the fins 218 (alternatively referred to herein as the surrounding regions). The selective etching also results in the creation or exposure of insulating caps 220 that reside on fins 218. The embodiment shown in FIG. 4 has composite insulating caps 220, each being formed from the remaining sections of the first and second layers of insulating material 214, 216.

As shown in FIG. 4, by anisotropically etching the intermediate semiconductor material 204 using the fin pattern mask 210 as an etch mask, the fabrication process exposes regions 222 of the intermediate semiconductor material 204 underlying the fins 218. In an exemplary embodiment, the intermediate layer of semiconductor material 204 is anisotropically etched to a depth relative to the base 224 of the fins 218 (or bottom surface the upper layer of semiconductor material 206) such that the height of the exposed regions 222 relative to the surrounding regions 223 of intermediate semiconductor material 204 is less than or equal to the width of the fins 218. In this regard, the height of the exposed regions 222 is less than or equal to the width of the exposed regions 222. For example, depending on the embodiment, the width of the fins 218 may range from about 10 nm to about 20 nm, wherein the intermediate semiconductor material 204 is etched to a depth of about 10 nm to 15 nm relative to the base 224 of the fins 218. Maintaining an aspect ratio for the exposed regions 222 where the width is greater than or equal to the height of the exposed regions 222 provides stability and/or support at the base of the fins 218 during subsequent process steps.

Figure 5:
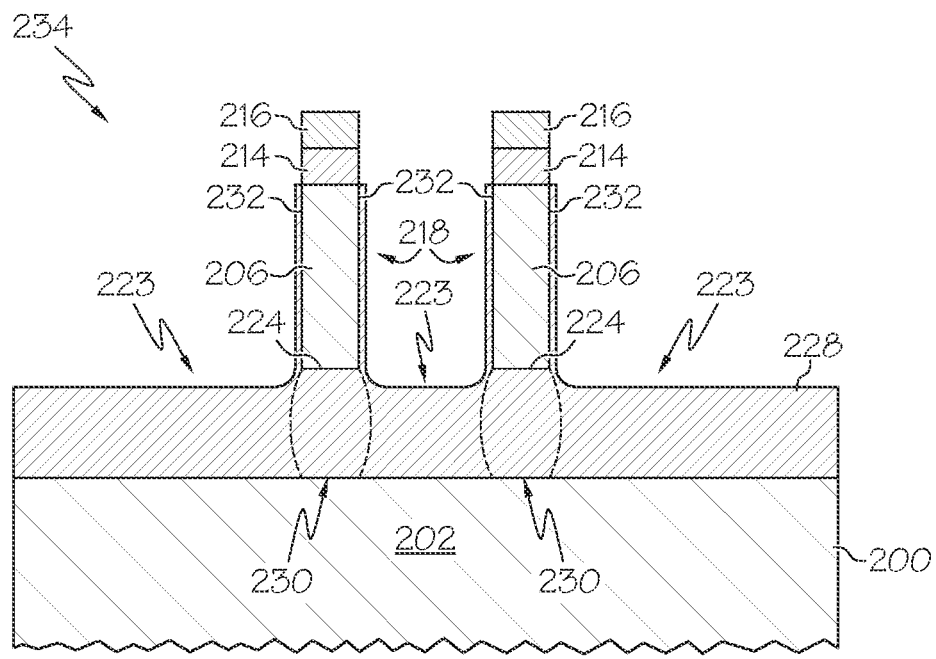

Referring now to FIG. 5, in an exemplary embodiment, the fabrication process continues by isolating (or insulating) the fins 218 from the bulk semiconductor material 202 by forming an isolation layer 228 that comprises an insulating material formed from the intermediate semiconductor material 206. In an exemplary embodiment, the isolation layer 228 is formed by performing a field oxidation process which oxidizes the exposed surfaces of semiconductor material 204, 206. During the field oxidation step, semiconductor device structure 226 of FIG. 4 is exposed to an oxidizing ambient in an elevated temperature that promotes selective growth of oxide material at the exposed surfaces of the semiconductor material 204, 206 resulting in the semiconductor device structure 234 of FIG. 5. Preferably, the exposed regions 222 of the intermediate semiconductor material 204 underlying the fins 218 are fully consumed during this field oxidation process, forming connecting regions 230 underlying fins 218. In this regard, in an embodiment where the intermediate semiconductor material 204 comprises silicon germanium, the connecting regions 230 underlying the fins 218 comprise an oxide material having a germanium concentration corresponding to the germanium concentration of the intermediate semiconductor material 204 prior to oxidation. In other words, the germanium concentration of the intermediate semiconductor material 204 prior to oxidation influences the germanium concentration of the oxide material of the connecting regions 230. In some practical embodiments, the germanium concentration of the oxide material of the connecting regions 230 may be approximately equal to the germanium concentration of the intermediate semiconductor material 204 prior to oxidation. Although FIG. 5 depicts the entire intermediate layer of semiconductor material 206 as being fully consumed, in alternative embodiments, some portions of the intermediate layer of semiconductor material 204 in the surrounding regions 223 may remain intact after oxidation. By oxidizing the exposed regions 222 of the intermediate semiconductor material 204 underlying the fins 218 to form connecting regions 230, the fins 218 are electrically isolated from each other. Additionally, the fins 218 are electrically isolated from the bulk substrate material 202 which, in turn, reduces leakage current (e.g., through the fins 218 to the bulk substrate material 202) and reduces the impact of neighboring devices on the same bulk substrate 200.

In practice, during the oxidation process, oxide material may also grow on the exposed semiconductor material 206 of the sidewalls 232 and/or base 224 of the fins 218. However, because the oxidation rate of the intermediate semiconductor material 204 is sufficiently greater than the oxidation rate of the upper semiconductor material 206, the exposed regions 222 underlying the fins 218 may be completely consumed with minimal oxide material formed on the sidewalls 232 and/or base 224 of the fins 218, which, in turn, preserves most (if not all) of the original height and width of the fins 218. For example, in an exemplary embodiment where the intermediate semiconductor material 204 comprises silicon germanium having a germanium concentration of about thirty percent germanium and the upper semiconductor material 206 comprises silicon, the thickness of the isolation layer 228 formed on the sidewalls of the fins 218 ranges from about 3 nm to 5 nm while the thickness of the isolation layer 228 formed from the regions 222, 223 of the intermediate semiconductor material 204 is about 20 nm to 30 nm.

Figure 1:
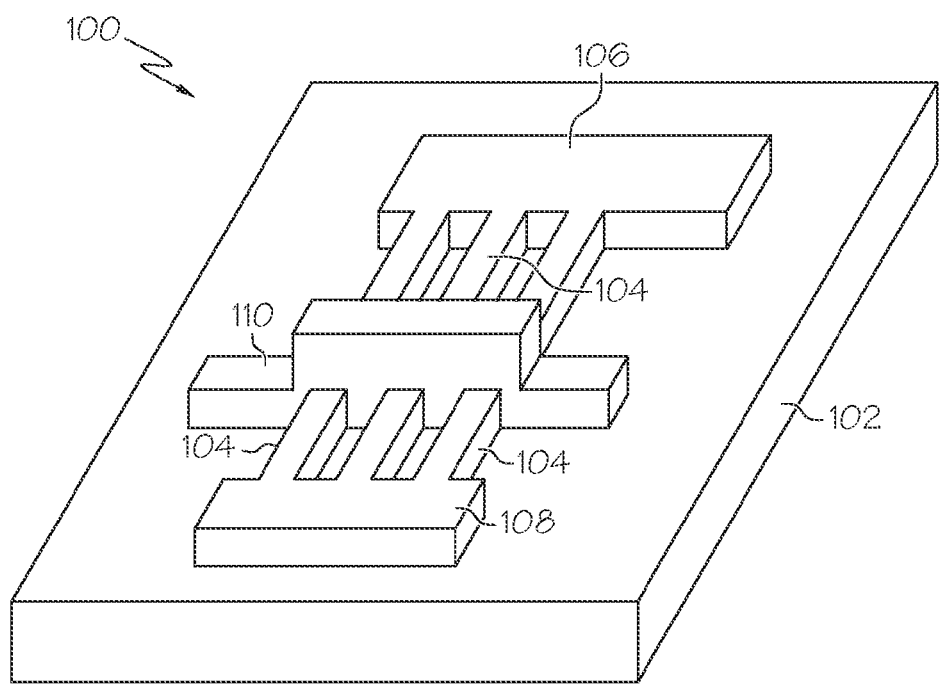
FIG. 1 is a simplified perspective view of a conventional FinFET having a plurality of fins.
Figure 6:
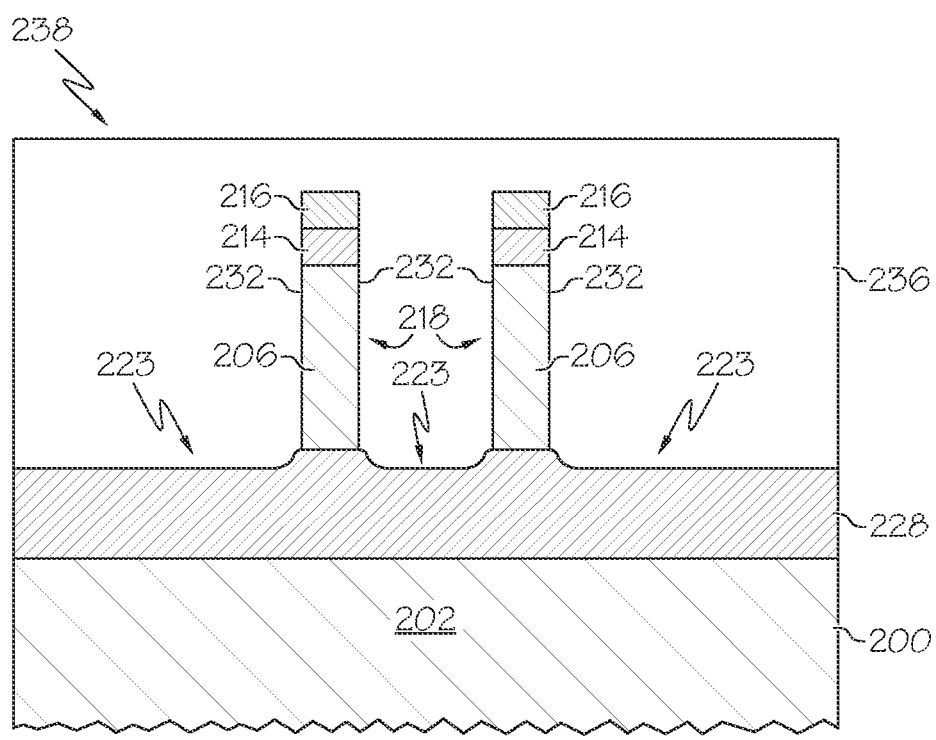

Although other fabrication steps or sub-processes may be performed after forming the isolation layer 228, in accordance with one embodiment, the fabrication process continues by removing portions of the isolation layer 228 on the sidewalls 232 of the fins 218 and forming a gate structure 236 overlying the fins 218, resulting in the semiconductor device structure 238 shown in FIG. 6. In an exemplary embodiment, the isolation layer 228 is removed from the sidewalls 232 of the fins 218 by isotropically etching the isolation layer 228 using an isotropic etchant that selectively etches the isolation layer 228 without attacking the upper semiconductor material 206. For example, when the isolation layer 228 comprises an oxide material, a hydrogen fluoride based etchant may be utilized to isotropically etch the isolation layer 228. The isotropic etchant also removes portions of the isolation layer 228 from the regions 223 surrounding the fins 218, however, in some embodiments, the thickness of the isolation layer 228 in the surrounding regions 223 will remain adequate to prevent undesired parasitic capacitance between the gate structure 236 and the bulk semiconductor material 202. Additionally, it should be appreciated that although FIG. 6 depicts the insulating material 214, 216 as remaining intact, in some embodiments, the isotropic etchant may also partially etch exposed portions of the insulating material 214, 216 depending on the particular type of insulating material and etchant utilized. The gate structure 236 can be created using a conventional gate stack module or any combination of well-known process steps. It should be appreciated that FIG. 6 is a cross sectional view of semiconductor device structure 238. Accordingly, gate structure 236 will actually be overlying only a section of each fin 218, and gate structure 236 will follow the overall contour of fins 218, contacting respective sections of sidewalls 232 and insulating materials 214, 216. In this regard, gate structure 236 "wraps" over fins 218 in the manner generally depicted in FIG. 1. Thereafter, any number of known process steps, modules, and techniques can be performed to complete the fabrication of one or more semiconductor devices that incorporate fins 218. For example, the manufacturing process can be carried out to complete the fabrication of at least one transistor device that includes fins 218 and gate structure 236. These final process steps, and other back end process steps, will not be described here.

Figure 7:
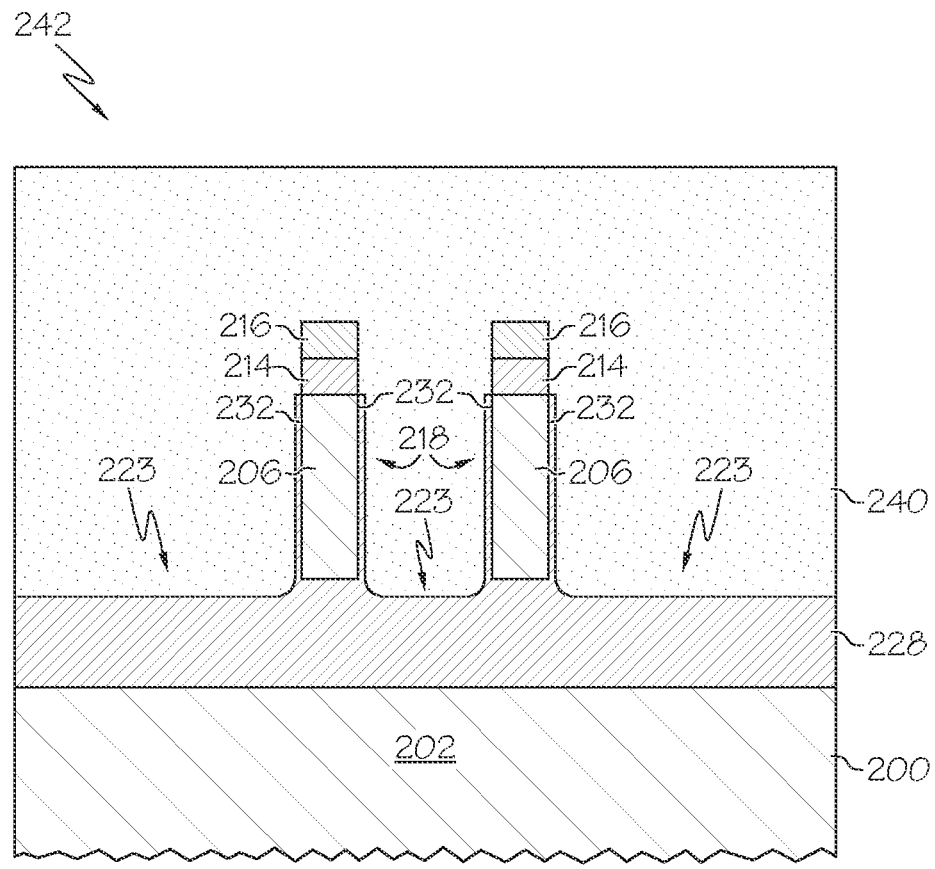
Figure 8:
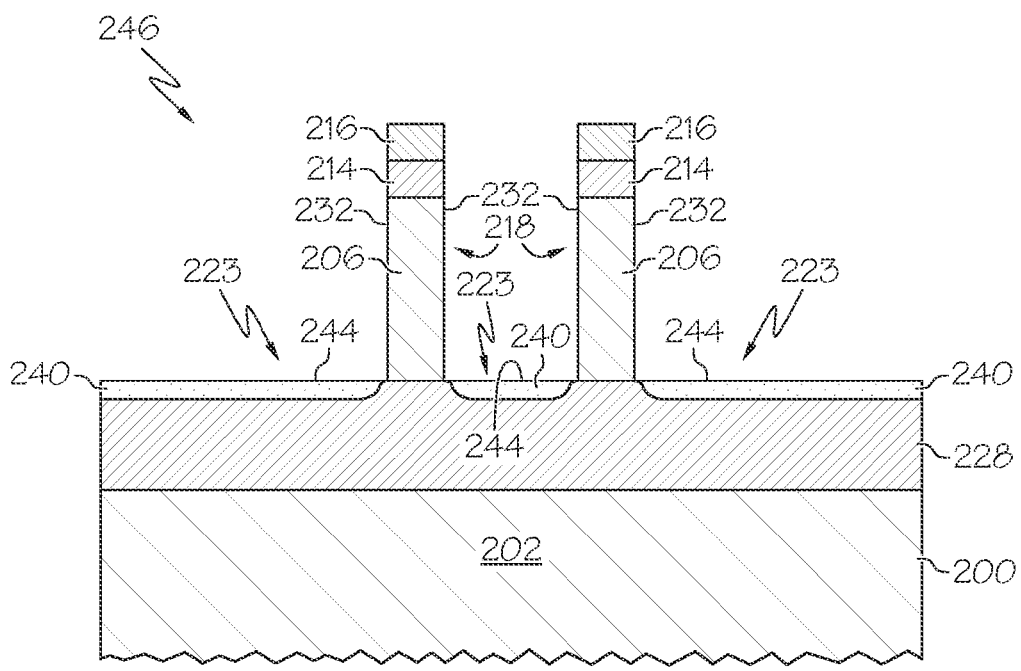

Referring now to FIG. 7 and FIG. 8, in some embodiments, it may be desirable that a semiconductor device subsequently formed from semiconductor device structure 234 has a thicker layer of insulating material in the regions 223 surrounding the fins 218, for example, to reduce unwanted parasitic capacitance between a gate structure subsequently formed overlying the fins 218 and the bulk semiconductor material 202. In this regard, in accordance with one or more embodiments, after forming the isolation layer 228 as described above in the context of FIG. 5, the fabrication process continues by forming a layer of dielectric material 240 (alternatively referred to herein as the dielectric layer) overlying the isolation layer 228 and the fins 218. As shown in FIG. 7, the thickness of the dielectric layer 240 is preferably chosen such that the dielectric material 240 fills the surrounding regions 223 and any gaps between the fins 218 to a minimum height that meets or exceeds the height of the fins 218. In an exemplary embodiment, the layer of dielectric material 240 is formed by conformally depositing a dielectric material, such as silicon oxide, overlying the isolation layer 228 and the fins 218 by chemical vapor deposition (CVD), low pressure chemical vapor deposition (LPCVD), or plasma enhanced chemical vapor deposition (PECVD), resulting in the semiconductor device structure 242 shown in FIG. 7. In this regard, in an exemplary embodiment, the isolation layer 228 and the dielectric layer 240 each comprise an oxide material, however, it will be appreciated in the art that the deposited dielectric layer 240 may be less dense than the isolation layer 228. Additionally, the germanium concentration of the isolation layer 228 is greater than that of the dielectric layer 240, which will typically be negligible (although some germanium may diffuse to the dielectric layer 240 at the interface with the isolation layer 228 during subsequent high temperature process steps).

Referring now to FIG. 8, in an exemplary embodiment, the fabrication process continues by removing portions of the dielectric layer 240 and the isolation layer 228 by isotropically etching the dielectric material 240 and the isolation layer 228 using an isotropic etchant that selectively etches the dielectric material 240 and the isolation layer 228 without attacking the semiconductor material 206 comprising the fins 218, in a similar manner as described above. In this regard, the isotropic etchant removes portions of the isolation layer 228 from the sidewalls 232 of the fins 218. In an exemplary embodiment, the dielectric layer 240 and/or isolation layer 228 are etched to thickness that provides sufficient isolation in the surrounding regions 223 between a subsequently formed gate structure and the bulk semiconductor material 202. In accordance with one embodiment, the upper surfaces 244 of the remaining dielectric layer 240 and/or isolation layer 228 in the regions 223 surrounding the fins 218 are substantially uniform and substantially aligned with the base 224 of the fins 218, resulting in the semiconductor device structure 246 shown in FIG. 8.

Although other fabrication steps or sub-processes may be performed after removing portions of the dielectric layer 240 and the isolation layer 228, in an exemplary embodiment, the fabrication process continues by forming a gate structure overlying the fins 218 and the surrounding dielectric layer 240 and/or isolation layer 228 in a similar manner as described above in the context of FIG. 6. Thereafter, any number of known process steps, modules, and techniques can be performed to complete the fabrication of one or more semiconductor devices that incorporate fins 218.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a semiconductor device on a bulk substrate, the method comprising:
   forming a layer of a first semiconductor material overlying the bulk substrate;
   forming a layer of a second semiconductor material overlying the layer of the first semiconductor material;
   creating a fin pattern mask on the layer of the second semiconductor material;
   anisotropically etching the layer of the second semiconductor material and the layer of the first semiconductor material using the fin pattern mask as an etch mask, resulting in a fin formed from the second semiconductor material and an exposed region of first semiconductor material underlying the fin; and
   forming an isolation layer in the exposed region of first semiconductor material underlying the fin;
   wherein anisotropically etching the layer of the first semiconductor material comprises anisotropically etching the layer of the first semiconductor material to a depth relative to a base of the fin that is less than or equal to a width of the fin.

2. The method of claim 1, wherein forming the isolation layer comprises growing an oxide material from the exposed region of first semiconductor material.

3. The method of claim 1, wherein forming the isolation layer comprises oxidizing the exposed region of first semiconductor material to form an oxide material underlying the fin.

4. The method of claim 3, wherein a germanium concentration of the oxide material corresponds to a germanium concentration of the first semiconductor material.

5. The method of claim 1, wherein forming the layer of the first semiconductor material comprises epitaxially growing the layer of the first semiconductor material on the bulk substrate.

6. The method of claim 5, the bulk substrate comprising silicon, wherein epitaxially growing the layer of the first semiconductor material on the bulk substrate comprises epitaxially growing a layer of silicon germanium on the bulk substrate.

7. The method of claim 6, wherein the layer of silicon germanium has a germanium concentration greater than ten percent germanium.

8. The method of claim 6, wherein forming the layer of the second semiconductor material comprises forming a layer of silicon overlying the layer of silicon germanium.

9. The method of claim 1, wherein the first semiconductor material has a first oxidation rate and the second semiconductor material has a second oxidation rate, the first oxidation rate being greater than the second oxidation rate.

10. The method of claim 1, further comprising:
    removing any portions of the isolation layer formed on sidewalls of the fin; and
    forming a gate structure overlying the fin.

11. A method of manufacturing a finned semiconductor device structure, the method comprising:
    providing a substrate comprising bulk semiconductor material, a layer of a first semiconductor material on the bulk semiconductor material, and a layer of a second semiconductor material on the layer of the first semiconductor material;
    selectively removing portions of the layer of second semiconductor material and the layer of first semiconductor material, resulting in a fin formed from the second semiconductor material overlying an exposed region of first semiconductor material; and
    forming an isolation layer in the exposed region of first semiconductor material;
    wherein selectively removing portions of the layer of first semiconductor material comprises anisotropically etching regions of the layer of the first semiconductor material surrounding the fin to a depth relative a base of the fin less than or equal to a width of the fin.

12. The method of claim 11, wherein forming the isolation layer comprises oxidizing the exposed region of first semiconductor material to isolate the fin from the bulk semiconductor material.

13. The method of claim 12, wherein the first semiconductor material comprises silicon germanium having a germanium concentration greater than about ten percent, such that oxidizing the exposed region of first semiconductor material results in a region of the isolation layer underlying the fin having a germanium concentration greater than about ten percent.

14. The method of claim 11, further comprising:
forming a layer of an oxide material overlying the isolation layer and the fin; and
removing portions of the layer of the oxide material such that an upper surface of the layer of the oxide material is substantially aligned with a base of the fin.

15. A method of fabricating a semiconductor device on a bulk substrate, the method comprising:
forming a layer of a first semiconductor material overlying the bulk substrate;
forming a layer of a second semiconductor material overlying the layer of the first semiconductor material;
creating a fin pattern mask on the layer of the second semiconductor material;
anisotropically etching the layer of the second semiconductor material and the layer of the first semiconductor material using the fin pattern mask as an etch mask, resulting in a fin formed from the second semiconductor material and an exposed region of first semiconductor material underlying the fin;
forming an isolation layer in the exposed region of first semiconductor material underlying the fin;
forming a layer of dielectric material overlying the isolation layer and the fin; and
removing portions of the layer of dielectric material such that an upper surface of the layer of dielectric material is substantially aligned with a bottom of the fin, wherein removing portions of the layer of dielectric material comprises isotropically etching the layer of dielectric material, wherein isotropically etching the layer of dielectric material also etches any portions of the isolation layer formed on sidewalls of the fin.

* * * * *